(12) United States Patent
Itakura et al.

(10) Patent No.: US 11,552,220 B2
(45) Date of Patent: Jan. 10, 2023

(54) ELECTRONIC COMPONENT MOUNTING PACKAGE FOR MOUNTING A LIGHT-EMITTING ELEMENT, ELECTRONIC DEVICE, AND ELECTRONIC MODULE

(71) Applicant: KYOCERA Corporation, Kyoto (JP)

(72) Inventors: Yoshiaki Itakura, Kyoto (JP); Akihiko Kitagawa, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 183 days.

(21) Appl. No.: 16/969,844

(22) PCT Filed: Feb. 25, 2019

(86) PCT No.: PCT/JP2019/007040
§ 371 (c)(1),
(2) Date: Aug. 13, 2020

(87) PCT Pub. No.: WO2019/163987
PCT Pub. Date: Aug. 29, 2019

(65) Prior Publication Data
US 2020/0381592 A1 Dec. 3, 2020

(30) Foreign Application Priority Data
Feb. 26, 2018 (JP) .............................. JP2018-032128

(51) Int. Cl.
*H01L 33/48* (2010.01)
*H01L 23/13* (2006.01)
(Continued)

(52) U.S. Cl.
CPC ............ *H01L 33/486* (2013.01); *H01L 23/13* (2013.01); *H01L 23/49838* (2013.01);
(Continued)

(58) Field of Classification Search
CPC ....... H01L 33/60; H01L 33/486; H01L 33/62; H01L 21/4857
See application file for complete search history.

(56) References Cited

U.S. PATENT DOCUMENTS

| 7,508,008 | B2 * | 3/2009 | Okimura | ................. | H01L 33/52 |
| | | | | | 257/E33.059 |
| 10,355,665 | B2 * | 7/2019 | Kisaki | .................. | H01L 23/552 |

(Continued)

FOREIGN PATENT DOCUMENTS

| JP | 2002-232017 A | 8/2002 |
| JP | 2008-016797 A | 1/2008 |

(Continued)

*Primary Examiner* — Allen L Parker
(74) *Attorney, Agent, or Firm* — Volpe Koenig

(57) ABSTRACT

An electronic component mounting package includes: an insulating base body including a principal face and a recess which opens in the principal face; and a metallic pattern including a plurality of metallic layers lying across a side face of the recess and the principal face. The metallic pattern includes, as an inner layer, at least one metallic layer selected from a tungsten layer, a nickel layer, and a gold layer, and an aluminum layer as an outermost layer. The metallic pattern includes an exposed portion corresponding to a part of the metallic layer constituting the inner layer which part is exposed at the principal face.

7 Claims, 8 Drawing Sheets

(51) Int. Cl.
*H01L 23/498* (2006.01)
*H01L 33/60* (2010.01)
*H01L 33/62* (2010.01)

(52) U.S. Cl.
CPC ........ *H01L 23/49866* (2013.01); *H01L 33/60* (2013.01); *H01L 33/62* (2013.01)

(56) References Cited

U.S. PATENT DOCUMENTS

| | | | | |
|---|---|---|---|---|
| 10,460,989 | B2* | 10/2019 | Takeda | G01R 33/0005 |
| 10,928,037 | B2* | 2/2021 | Miyoshi | H01L 33/505 |
| 2006/0147746 | A1* | 7/2006 | Wakako | H05K 3/246 |
| | | | | 428/673 |
| 2006/0208271 | A1* | 9/2006 | Kim | H01L 33/486 |
| | | | | 257/100 |
| 2008/0006837 | A1* | 1/2008 | Park | H01L 33/486 |
| | | | | 257/E33.072 |
| 2010/0012967 | A1* | 1/2010 | Choi | H01L 33/486 |
| | | | | 257/E33.057 |
| 2012/0162984 | A1* | 6/2012 | Fujimori | H01L 33/486 |
| | | | | 438/27 |
| 2013/0105978 | A1* | 5/2013 | Hung | H01L 33/60 |
| | | | | 438/653 |
| 2015/0362158 | A1 | 12/2015 | Igata et al. | |
| 2017/0054071 | A1* | 2/2017 | Takeda | H01L 29/045 |
| 2018/0040789 | A1* | 2/2018 | Kim | H04N 5/238 |
| 2019/0189870 | A1 | 6/2019 | Ichinokura | |

FOREIGN PATENT DOCUMENTS

| | | |
|---|---|---|
| JP | 2008-140717 A | 6/2008 |
| JP | 2015-018873 A | 1/2015 |
| JP | 2016-004913 A | 1/2016 |
| JP | 2016-213213 A | 12/2016 |
| JP | 2017-168635 A | 9/2017 |
| JP | 2018-037583 A | 3/2018 |

* cited by examiner

ELECTRONIC COMPONENT MOUNTING PACKAGE FOR MOUNTING A LIGHT-EMITTING ELEMENT, ELECTRONIC DEVICE, AND ELECTRONIC MODULE

CROSS-REFERENCE TO RELATED APPLICATIONS

This application is a national stage entry according to 35 U.S.C. 371 of International Application No. PCT/JP2019/007040, filed on Feb. 25, 2019, which claims priority to Japanese Patent Application No. 2018-032128, filed on Feb. 26, 2018, the contents of which are entirely incorporated herein by reference.

TECHNICAL FIELD

The present disclosure relates to an electronic component mounting package for mounting an electronic component such for example as a light-emitting element, and to an electronic device and an electronic module.

BACKGROUND

A light-emitting element housing package including a recess for mounting a light-emitting element and associated components, and a light-emitting device are known (refer to Japanese Unexamined Patent Publication JP-A 2002-232017, for example).

SUMMARY

An electronic component mounting package according to the disclosure includes: an insulating base body including a principal face and a recess which opens in the principal face; and a metallic pattern including a plurality of metallic layers lying across a side face of the recess and the principal face, the metallic pattern including, as an inner layer, at least one metallic layer selected from a tungsten layer, a nickel layer, and a gold layer, and an aluminum layer as an outermost layer, the metallic pattern including an exposed portion corresponding to a part of the metallic layer exposed at the principal face.

An electronic device according to the disclosure includes: the electronic component mounting package mentioned above; an electronic component mounted in the electronic component mounting package; and a lid body joined to the exposed portion of the electronic component mounting package.

An electronic module according to the disclosure includes: a module substrate including a connection pad; and the electronic device mentioned above, connected via solder to the connection pad.

DETAILED DESCRIPTION

Exemplary embodiments of the disclosure will now be described with reference to the accompanying drawings.

Figure 1:
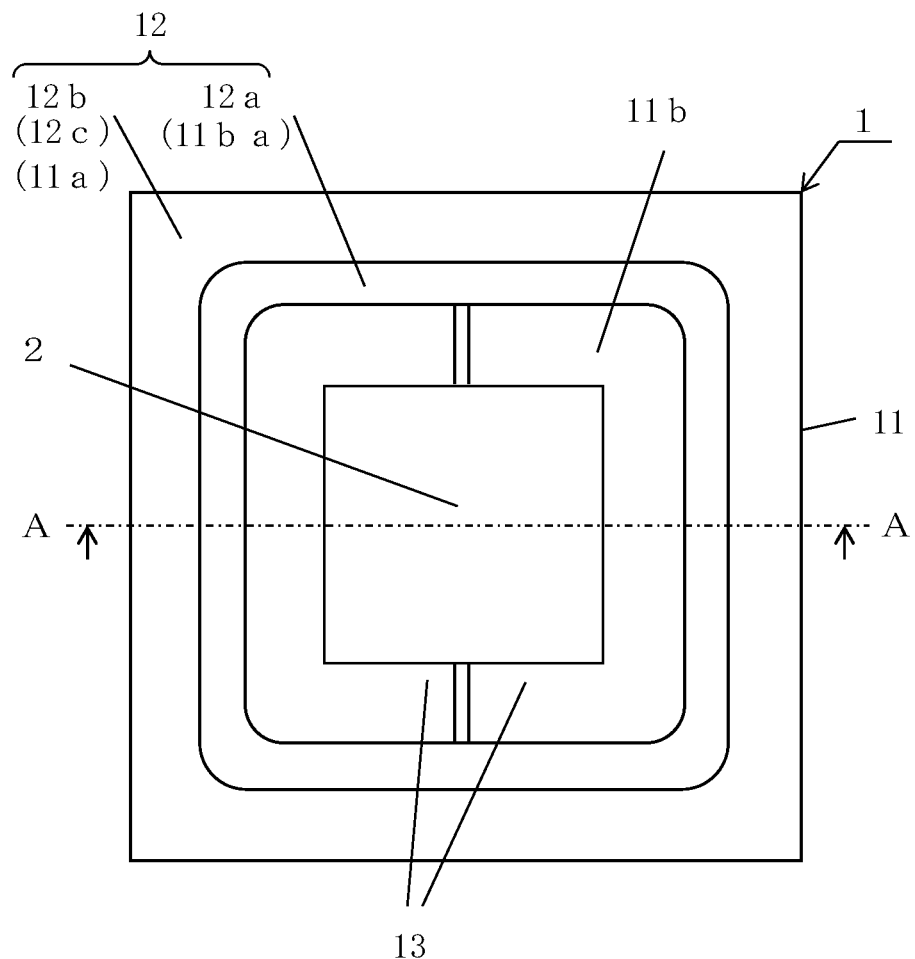
FIG. 1 is a top view showing an electronic device, with a lid body omitted, in accordance with an embodiment.
Figure 2:
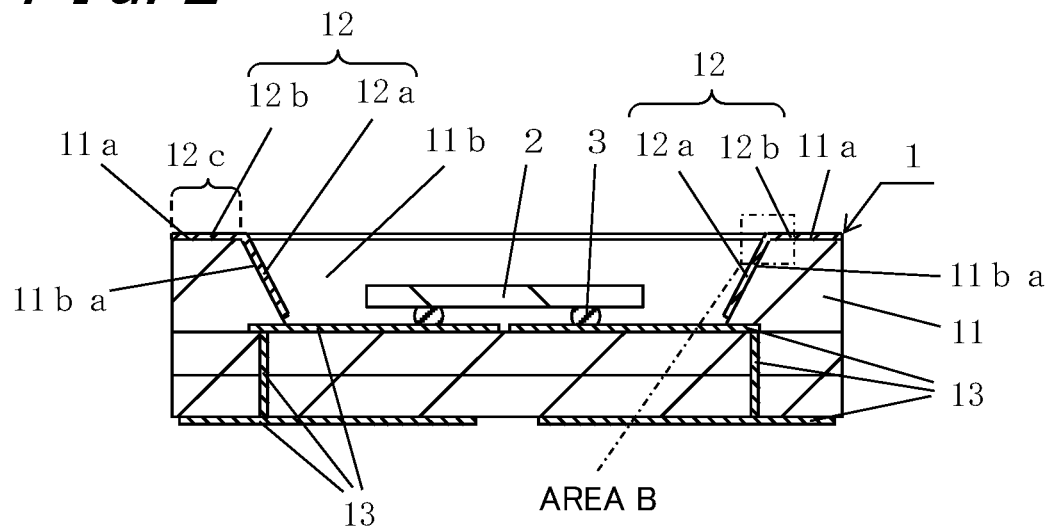
FIG. 2 is a longitudinal sectional view taken along the line A-A shown in FIG. 1.
Figure 3:
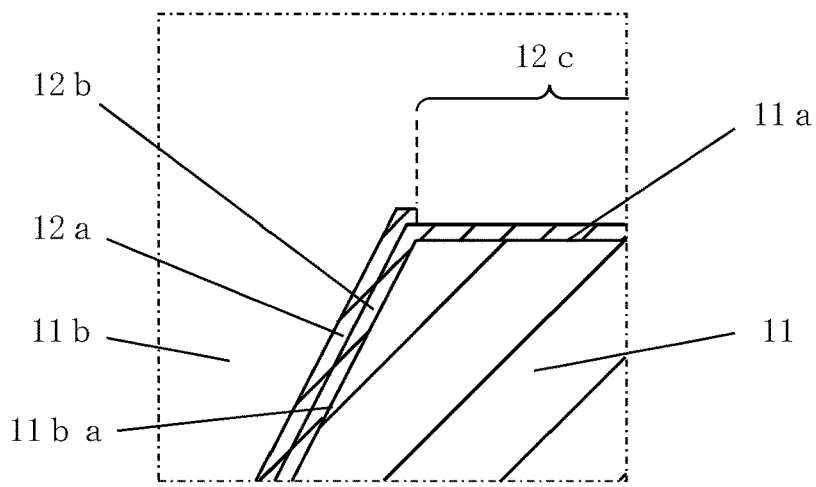
FIG. 3 is an enlarged longitudinal sectional view of main components, illustrating an area B shown in FIG. 2.
Figure 4:
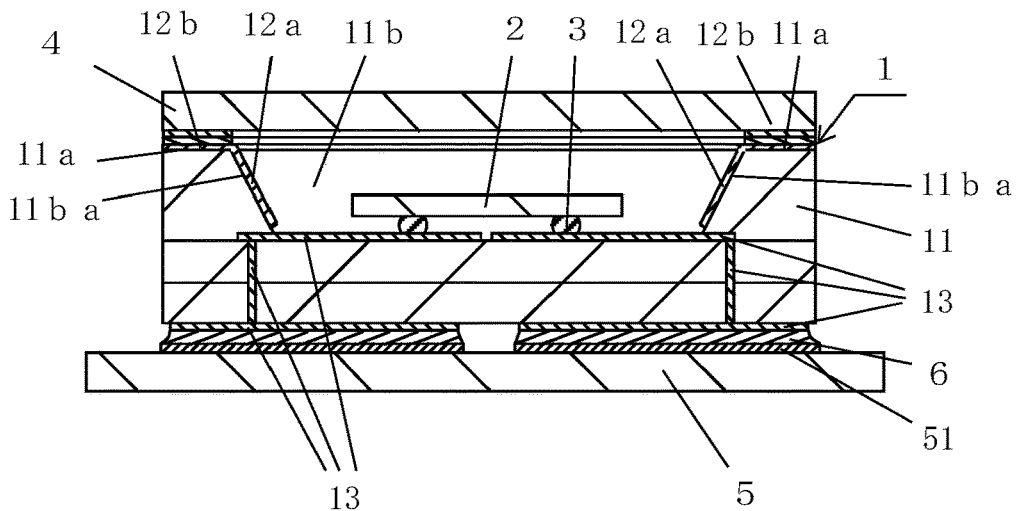
FIG. 4 is a longitudinal sectional view showing an electronic module according to the embodiment.
Figure 5:
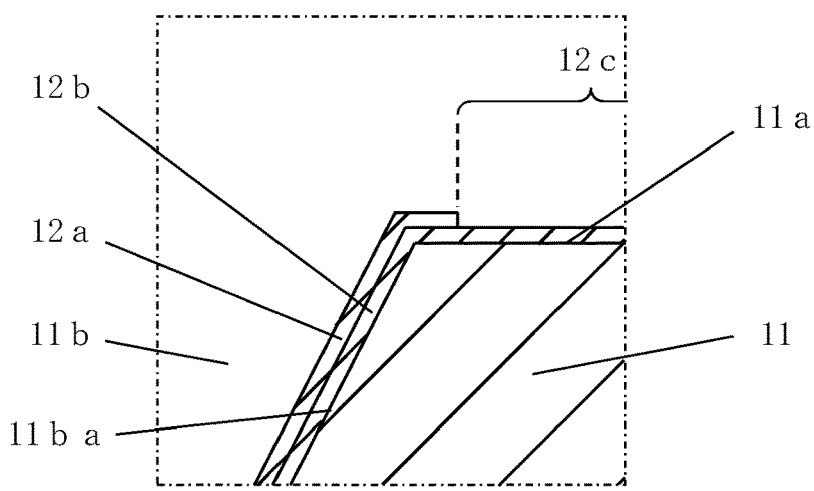
FIG. 5 is an enlarged longitudinal sectional view showing main components of another example of the electronic device, with the lid body omitted, according to the embodiment.

Referring to FIGS. 1 to 11, an electronic device according to an embodiment of the disclosure will be described. In this embodiment, the electronic device includes an electronic component mounting package 1, an electronic component 2, and a lid body 4. As shown in FIG. 4, for example, the electronic device is connected via solder 6 onto a module substrate 5 which constitutes an electronic module.

For example, the electronic component mounting package 1 according to the embodiment includes: an insulating base body 11 including a principal face 11a and a recess 11b which opens in the principal face 11a; and a metallic pattern 12 lying across a side face 11ba of the recess 11b and the principal face 11a.

The insulating base body 11 may be made of ceramics, e.g. an aluminum oxide sintered body (alumina ceramics), an aluminum nitride sintered body, a mullite sintered body, or a glass ceramic sintered body.

In the case where the insulating base body 11 is made of a resin material, for example, it is possible to use epoxy resin, polyimide resin, acrylic resin, phenol resin, polyester resin, and fluorine resin typified by tetrafluoroethylene resin.

For example, in the case where the insulating base body 11 is made of aluminum nitride sintered body, the production of the insulating base body 11 involves the following successive steps: admixing suitable organic binder, solvent, etc. in powdery raw materials, namely aluminum nitride used as a major constituent, and yttria, erbia, etc. used as sintering aids, to prepare a slurry; shaping the slurry into a sheet by means of the doctor blade method, the calender roll method, or otherwise to obtain a ceramic green sheet; subjecting the ceramic green sheet to suitable punching process; stacking the ceramic green sheets together to constitute a green laminate for forming the insulating base body 11; and firing the green laminate at a high temperature (about 1800° C.). Note that aluminum nitride can be said to be a major constituent so long as it is contained in the insulating base body 11 in an amount of greater than or equal to 80% by mass based on the mass of the entire insulating base body 11 given as 100% by mass. Aluminum nitride may be contained in the insulating base body 11 in an amount of greater than or equal to 95% by mass. The insulating base body 11 including an aluminum nitride content of greater than or equal to 95% by mass is likely to exhibit a thermal conductivity of 150 W/mK or more. This allows the electronic component mounting package 1 to deliver outstanding heat dissipation performance.

The recess 11*b* is configured to accommodate the electronic component 2 such as a light-emitting element and mount the electronic component 2 on the bottom of the recess 11*b*, and is disposed in the principal face 11*a* of the insulating base body 11. The recess 11*b* is, as exemplified in FIGS. 1 to 11, quadrangular as seen in a plan view.

The recess 11*b* can be obtained by forming a through hole, which defines the side face 11*ba* (side wall) of the recess 11*b*, in each of a plurality of ceramic green sheets for forming the insulating base body 11 by means of lasering, die-punching process, or otherwise, and thereafter laminating these ceramic green sheets on other through hole-free ceramic green sheet. In the case where the thickness of the insulating base body 11 is small, the lasering or die-punching process for forming the through hole which constitutes the recess 11*b* is preferably carried out after the lamination of ceramic green sheets in the interest of high working accuracy.

Moreover, as exemplified in FIGS. 1 to 11, when the side face 11*ba* of the recess 11*b* is inclined toward an opening of the recess, for example, in the case where the electronic component 2 is a light-emitting element, light emitted laterally from the light-emitting element can be satisfactorily reflected upward from the side wall, with the consequent increase in luminance level in the electronic device. An angle θ between the side wall of the recess 11*b* and the bottom of the recess 11*b* (the principal face 11*a*) may be an obtuse angle of 110 degrees to 145 degrees, in particular. Setting the angle θ at a value within the above-described range facilitates stable and efficient formation of the inclined inner side of the through hole by punching work, and thus allows easy downsizing of the electronic device using the electronic component mounting package 1.

The side wall of the recess 11*b* inclined at the angle θ is formed by punching the ceramic green sheet with a punching die set to have a large clearance between a punch diameter and a die hole diameter. That is, by setting a clearance between a punch diameter and a die hole diameter to a large value, in punching the ceramic green sheet from one of the sheet principal faces toward the other, the ceramic green sheet is sheared from the edge of its surface in contact with the punch toward the edge of its surface in contact with the die hole, so that the through hole widens in diameter from the one principal face to the other principal face. Setting the clearance between the punch diameter and the die hole diameter in accordance with, for example, the thickness of the ceramic green sheet permits adjustment of the angle set for the inner side face of the through hole formed in the ceramic green sheet.

Alternatively, the through hole whose diameter widens from the one principal face to the other principal face at the angle θ as described above can be obtained by forming a through hole with an angle of approximately 90 degrees by punching work using a punching die set to have a small clearance between the punch diameter and the die hole diameter, and thereafter pressing a die shaped in a truncated cone or a truncated pyramid against the inner side face of the through hole.

A wiring conductor 13 is configured to electrically connect the electronic component 2 mounted in the electronic component mounting package 1 and the module substrate 5, and is disposed on the surface and in the interior of the insulating base body 11. For example, one end of the wiring conductor 13 is led out to the bottom of the recess 11*b*, and the other end of the wiring conductor 13 is led out to the lower face of the insulating base body 11. The wiring conductor 13 is configured to electrically connect the electronic component 2 in the electronic component mounting package 1 and an external circuit board. The wiring conductor 13 includes: a wiring conductor located on the surface or in the interior of the insulating base body 11; and a through conductor which passes vertically through insulating layers which constitute the insulating base body 11 and electrically connects the upper wiring conductor and the lower wiring conductor.

As the wiring conductor 13, a metal material such as tungsten (W), molybdenum (Mo), manganese (Mn), silver (Ag), or copper (Cu) can be used. For example, in the case where the insulating base body 11 is made of an aluminum oxide sintered body, the wiring conductor 13 is formed so as to be deposited in predetermined locations in the insulating base body 11 by applying a conductor paste for forming the wiring conductor 13, which is prepared by admixing suitable organic binder, solvent, etc. in powder of high-melting-point metal such as W, Mo, or Mn, in a predetermined pattern to a ceramic green sheet for forming the insulating base body 11 by printing process using the screen printing method, and thereafter firing the conductor paste together with the insulating base body 11-forming ceramic green sheet. In the case where the wiring conductor 13 is in a form of the through conductor, the wiring conductor 13 is obtained by forming a through hole in a green sheet by die-punching process or lasering, and thereafter charging a conductor paste for forming the wiring conductor 13 into the through hole by the printing method.

An exposed surface of the wiring conductor 13 is deposited with a plating layer by electrolytic deposition or electroless deposition. The plating layer is made of metal which is highly resistant to corrosion and affords high connectability to a connection member, such as nickel, copper, gold, or silver. For example, the exposed surface is deposited successively with a nickel plating layer having a thickness of about 0.5 μm to 5 μm and a gold plating layer having a thickness of about 0.1 μm to 3.0 μm. This makes it possible to retard corrosion of the wiring conductor 13 effectively, and to strengthen the connection between the wiring conductor 13 and the electronic component 2 via a connection member 3, the connection between the wiring conductor 13 and a connection member such as a bonding wire, and the connection between the wiring conductor 13 and a wiring of the external module substrate 5.

Moreover, the surface of the wiring conductor 13 exposed out of the insulating base body 11 may be deposited with a silver plating layer having a thickness of about 1 μm to 10 μm. For example, the silver plating layer deposited as an outermost layer on the surface of the wiring conductor 13 allows the electronic device to satisfactorily reflect light emitted from the light-emitting element toward the wiring conductor 13.

Moreover, a plating layer made of other metal than the aforenamed metals, for example, a palladium plating layer may be interposed between these plating layers.

The outermost surface of one wiring conductor 13 may be deposited with a silver plating layer, whereas the outermost surface of the other wiring conductor 13 may be deposited with a gold plating layer. This is because the gold plating layer holds superiority in connectability to the connection member and the wiring of an external circuit board over the silver plating layer, whereas the silver plating layer holds superiority in light reflectivity over the gold plating layer. Moreover, the outermost surface of the wiring conductor 13 may be deposited with a silver-gold alloy plating layer, for example, an all-proportional solid-solution silver-gold alloy plating layer.

The metallic pattern 12 is located apart from the wiring conductor 13 and lies across each of four side faces 11ba of the recess 11b and the principal face 11a. Here, the language "the metallic pattern 12 being apart from the wiring conductor 13" indicates that the wiring conductor 13 and the metallic pattern 12 are electrically independent of each other. For example, the metallic pattern 12 extends from an intermediate point on each side face 11ba of the recess 11b spaced by 0.05 to 0.2 mm away from the bottom of the recess 11b. For example, with the electronic component 2, e.g. a light-emitting element set on the bottom of the recess 11b, an end of the metallic pattern 12 located on the bottom side of the recess 11b may be located closer to the bottom of the recess 11b than the light-emitting surface of the light-emitting element.

The metallic pattern 12 includes a plurality of metallic layers lying across each side face 11ba of the recess 11b and the principal face 11a, namely at least one metallic layer 12b selected from a tungsten layer, a nickel layer, and a gold layer, as an inner layer, and an aluminum layer as an outermost layer 12a. As the outermost layer 12a of the metallic pattern 12, an aluminum layer which holds superiority in, for example, reflectivity for light emitted from the light-emitting element over the insulating base body 11 can be used. For example, under a thin-film forming technique such as vapor deposition, ion plating, or sputtering, the metallic pattern 12 is provided so as to lie across each side face 11ba of the recess 11b and the principal face 11a of the insulating base body 11. Moreover, in order to enhance adherability between the insulating base body 11 and the aluminum layer which constitutes the outermost layer 12a of the metallic pattern 12, at least one metallic layer 12b selected from a tungsten layer, a nickel layer, and a gold layer is disposed as an inner layer between the insulating base body 11 and the aluminum layer. In addition, between the aluminum-made outermost layer 12a and the metallic layer 12b including the tungsten layer, the nickel layer, and the gold layer, a titanium layer may be interposed as a barrier layer to restrain tungsten, nickel, or gold from spreading to the aluminum-made outermost layer 12a. The inner metallic layer 12b has a thickness of about 0.1 μm to 50 μm, the barrier layer has a thickness of about 0.05 μm to 0.5 μm, and the outermost layer 12a has a thickness of about 0.05 μm to 3 μm.

The metallic pattern 12 includes an exposed portion 12c corresponding to a part of the inner metallic layer 12b exposed at the principal face 11a of the insulating base body 11. As will be hereinafter described, a lid body 4, which is made of glass, resin, ceramics, or the like, and whose sealing portion is provided with a gold layer, a platinum layer, or a chromium layer, is sealingly joined to the exposed portion 12c of the metallic pattern 12 via a joining material such as AuSn. The joining material such as AuSn is less likely to be wet by the aluminum layer which constitutes the outermost layer 12a of the metallic pattern 12, and yet is readily wet by the tungsten layer, the nickel layer, and the gold layer which constitute the inner layer. The exposed portion 12c is of a frame shape and is located in a region from the inner edge of the recess 11b to the outer edge of the insulating base body 11 as seen in a plan view.

As described above, the metallic pattern 12 includes a plurality of metallic layers lying across each side face 11ba of the recess 11b and the principal face 11a, namely at least one metallic layer 12b selected from a tungsten layer, a nickel layer, and a gold layer, as the inner layer, and the aluminum layer as the outermost layer 12a. The metallic pattern 12 also includes the exposed portion 12c corresponding to a part of the inner metallic layer 12b exposed at the principal face 11a of the insulating base body 11. With the above described configuration, for example, when joining the lid body 4 to the exposed portion 12c of the electronic component mounting package 1, a joining material used to join the lid body 4 to the exposed portion 12c of the electronic component mounting package 1 may be readily retained at the exposed portion 12c so as not to flow toward the recess 11b with the aid of the aluminum layer which constitutes the outermost layer 12a, which is less likely to be wet by the joining material. This reduces the interference of the joining material with light reflection, and thus permits reflection of light from the aluminum layer. Consequently, the electronic component mounting package 1 achieves satisfactory light reflection.

The exposed surface of the wiring conductor 13 may be provided with the above-described plating layer prior to the formation of the metallic pattern 12 on the insulating base body 11, that is, the exposed surface of the wiring conductor 13 may be deposited with the above-described plating layer in advance. This makes it possible to suppress surface deterioration of the metallic pattern 12 caused by a plating solution, etc. in the course of the production of the electronic component mounting package 1.

Moreover, in order to facilitate handling and efficiently product a large number of packages in the case of small-sized electronic component mounting packages 1, the electronic component mounting packages 1 may be produced by using a multipiece substrate including a plurality of insulating base body 11-forming regions arranged in a matrix. In the above-described case, a V-shaped groove is formed along the outer edge of each insulating base body 11-forming region, and the metallic patterns 12 corresponding to the plurality of insulating base body 11-forming regions are formed at one time. This makes it possible to efficiently form the electronic component mounting packages 1 each including the metallic pattern 12 lying across each side face 11ba of the recess 11b and the principal face 11a.

Moreover, as exemplified in FIGS. 5 to 11, the aluminum layer includes a portion lying across each side face 11ba of the recess 11b and a recess 11b-side part of the principal face 11a. With the above-described configuration, for example, when joining the lid body 4 to the exposed portion 12c of the electronic component mounting package 1 via a joining material, in the presence of the portion of the aluminum layer, which is less likely to be wet by the joining material, lying across each side face 11ba of the recess 11b and the recess 11b-side part of the principal face 11a, the joining material is less likely to be located at the recess 11b-side part of the principal face 11a. This reduces the interference of the joining material with light reflection, and thus permits reflection of light from the aluminum layer. Consequently, the electronic component mounting package 1 achieves satisfactory light reflection. Note that the aluminum layer may include a portion extending over the entire area of each side face 11ba of the recess 11b and also over the entire area of the recess 11b-side part of the principal face 11a.

Moreover, as exemplified in FIGS. 6 to 11, the exposed portion 12c is of a frame shape and includes a narrow region 12ca which is partly reduced in width. With the above-described configuration, for example, when joining the lid body 4 to the exposed portion 12c of the electronic component mounting package 1 via a joining material, in the presence of the aluminum layer, which is less likely to be wet by the joining material, located outside the recess 11b-side part of the narrow region 12ca, the joining material is less likely to be located outside the recess 11b-side part of the narrow region 12ca. This reduces the interference of the joining material with light reflection, and thus permits reflection of light from the aluminum layer. Consequently, the electronic component mounting package 1 achieves satisfactory light reflection.

Figure 6:
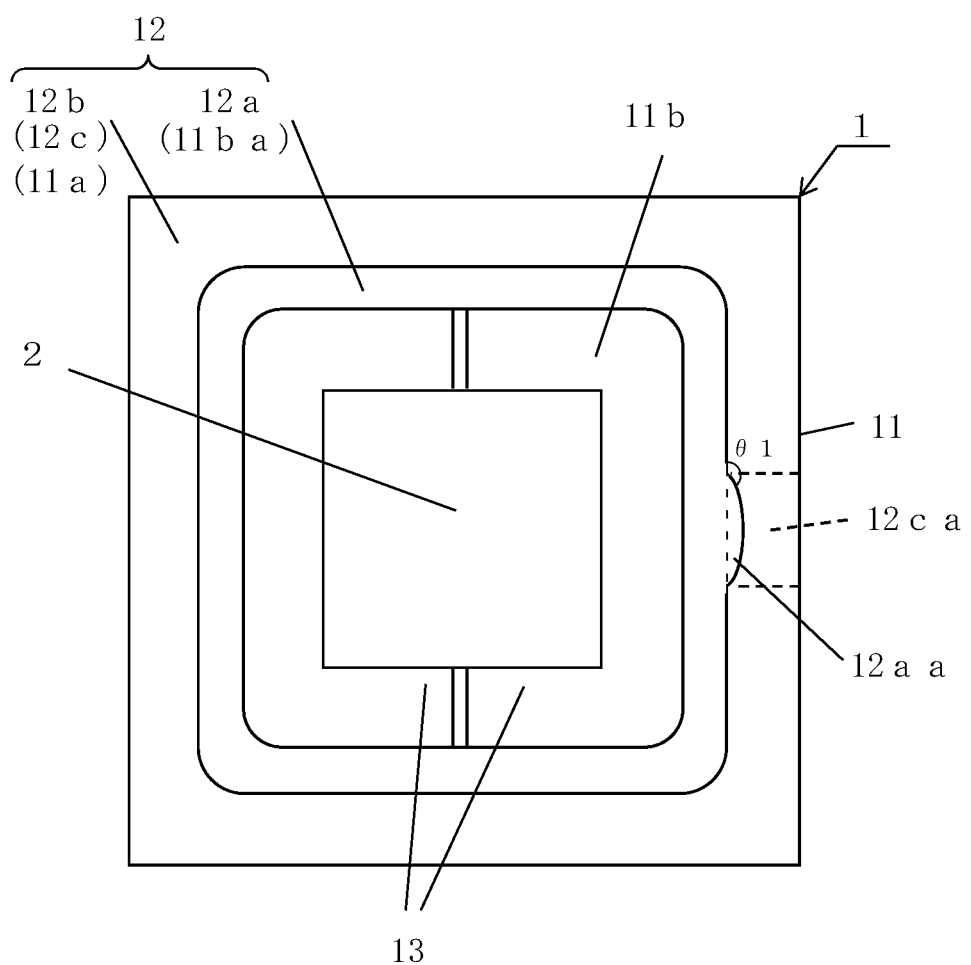
FIG. 6 is a top view showing another example of the electronic device, with the lid body omitted, according to the embodiment.

Moreover, as exemplified in FIG. 6, the narrow region 12ca is located at a side of the exposed portion 12c. With the above-described configuration, for example, when joining the lid body 4 to the exposed portion 12c of the electronic component mounting package 1 via a joining material, in the presence of the aluminum layer, which is less likely to be wet by the joining material, positioned correspondingly to the narrow region 12ca located at a side of the frame-shaped exposed portion 12c, the joining material is less likely to spread and flow toward the side face 11ba of the recess 11b corresponding to the side of the exposed portion 12c. This reduces the interference of the joining material with light reflection, and thus permits reflection of light from the aluminum layer. Consequently, the electronic component mounting package 1 achieves satisfactory light reflection. Note that the narrow region 12ca may be located at each of four sides of the exposed portion 12c.

Moreover, as exemplified in FIGS. 7 to 10, the narrow region 12ca is located at a corner of the exposed portion 12c. With the above-described configuration, for example, when joining the lid body 4 to the exposed portion 12c of the electronic component mounting package 1, even if the possibility arises that a joining material used to join the lid body 4 to the exposed portion 12c of the electronic component mounting package 1 will flow to a corner of the recess 11b and remain there, the aluminum layer, which is less likely to be wet by the joining material, positioned correspondingly to the narrow region 12ca located at a corner of the frame-shaped exposed portion 12c restrains the joining material from flowing toward the corner of the recess 11b. This reduces the interference of the joining material with light reflection, and thus permits reflection of light from the aluminum layer. Consequently, the electronic component mounting package 1 achieves satisfactory light reflection. Note that the narrow region 12ca may be located at each of four corners of the exposed portion 12c.

Figure 7:
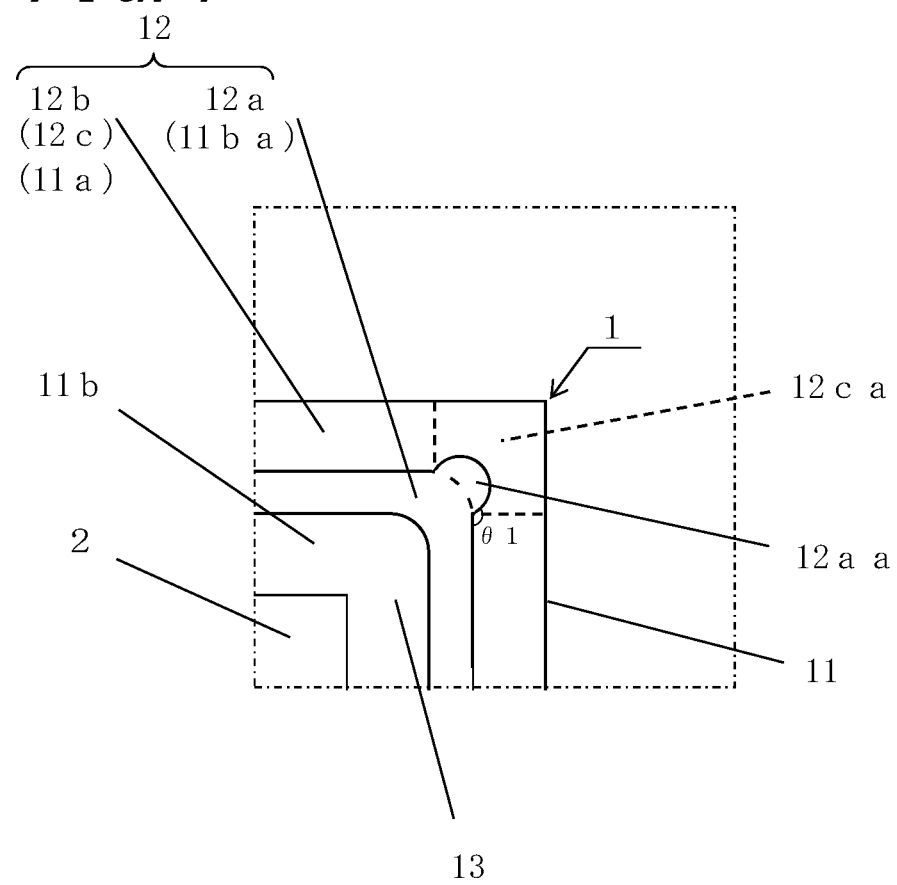
FIG. 7 is an enlarged plan view showing main components of another example of the electronic device, with the lid body omitted, according to the embodiment.
Figure 8:
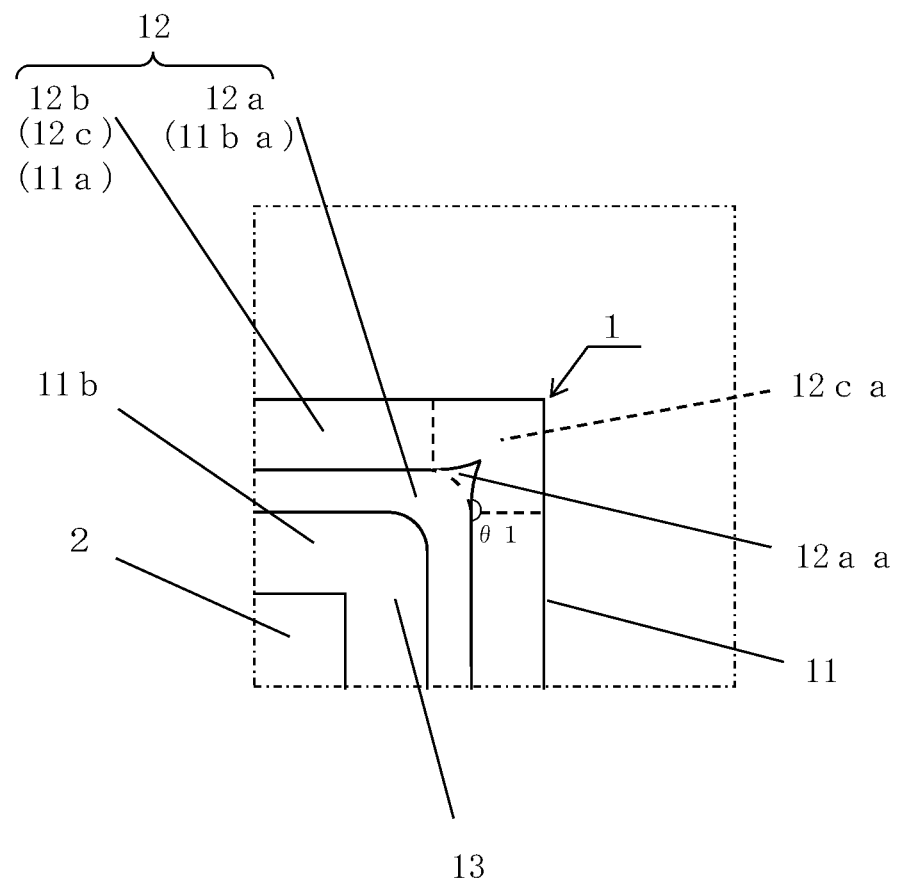
FIG. 8 is an enlarged plan view showing main components of still another example of the electronic device, with the lid body omitted, according to the embodiment.
Figure 9:
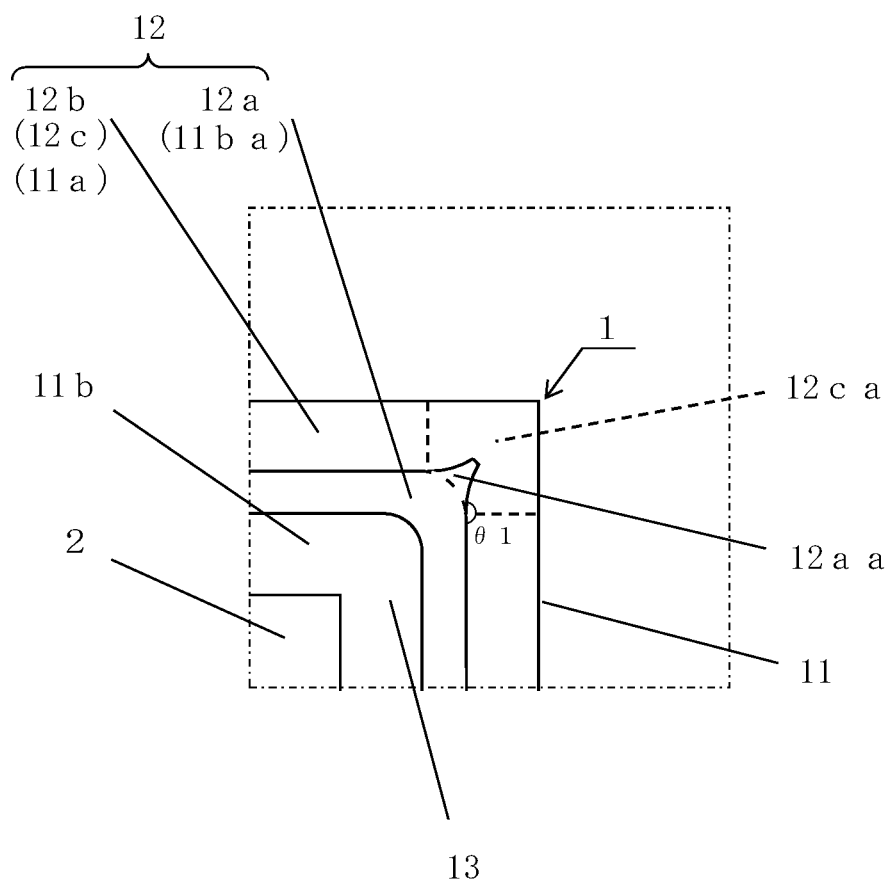
FIG. 9 is an enlarged plan view showing main components of still another example of the electronic device, with the lid body omitted, according to the embodiment.
Figure 10:
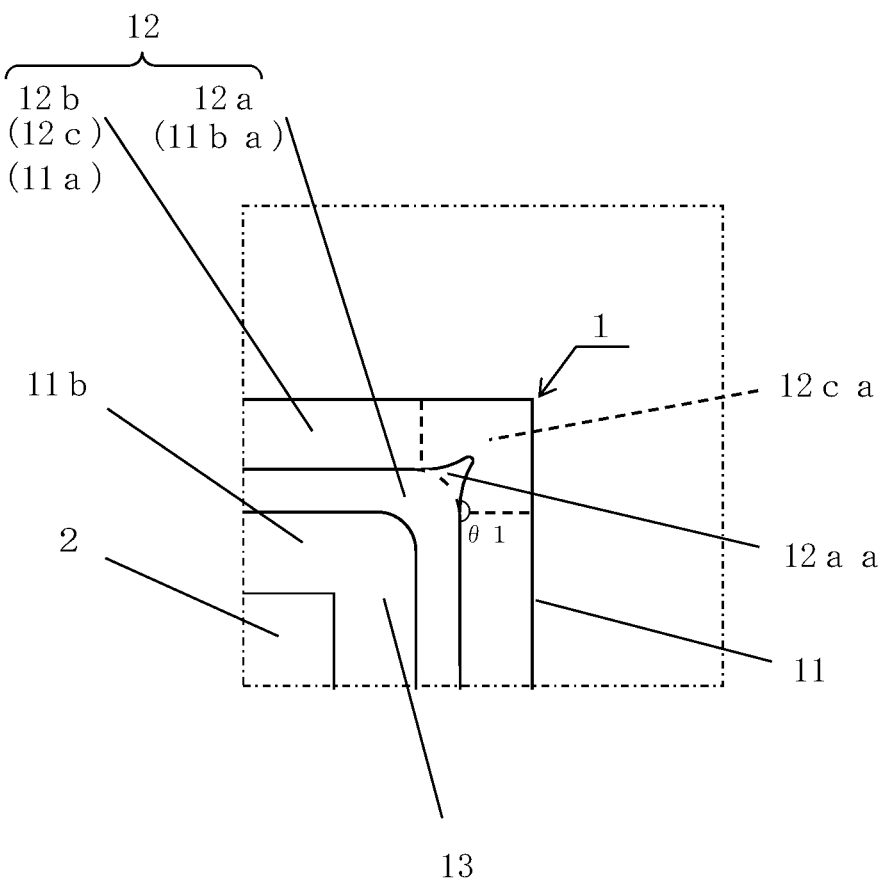
FIG. 10 is an enlarged plan view showing main components of still another example of the electronic device, with the lid body omitted, according to the embodiment.

Moreover, as exemplified in FIGS. 6 to 11, the aluminum layer includes a protrusion 12aa which protrudes toward the exposed portion 12c as seen in a plan view. With the above-described configuration, for example, when joining the lid body 4 to the exposed portion 12c of the electronic component mounting package 1 via a joining material, in the presence of the protrusion 12aa of the aluminum layer, which is less likely to be wet by the joining material, extending toward the exposed portion 12c as seen in a plan view, the joining material is less likely to be located at the protrusion 12aa. This reduces the interference of the joining material with light reflection, and thus permits reflection of light from the aluminum layer. Consequently, the electronic component mounting package 1 achieves satisfactory light reflection. In the case where the side of the aluminum layer is provided with the protrusion 12aa, the protrusion 12aa may be located at each of the four sides of the aluminum layer, and in the case where the corner of the aluminum layer is provided with the protrusion 12aa, the protrusion 12aa may be located at each of the four corners of the aluminum layer. Moreover, the outer configuration of the protrusion 12aa may be any of an elliptically arcuate form as shown in FIG. 6, a circularly arcuate form as shown in FIG. 7, a pointed form with an acute tip as shown in FIG. 8, a form with a projecting tip having a quadrangular sectional profile, and a form with a projecting arcuate tip as shown in FIG. 10.

Figure 11:
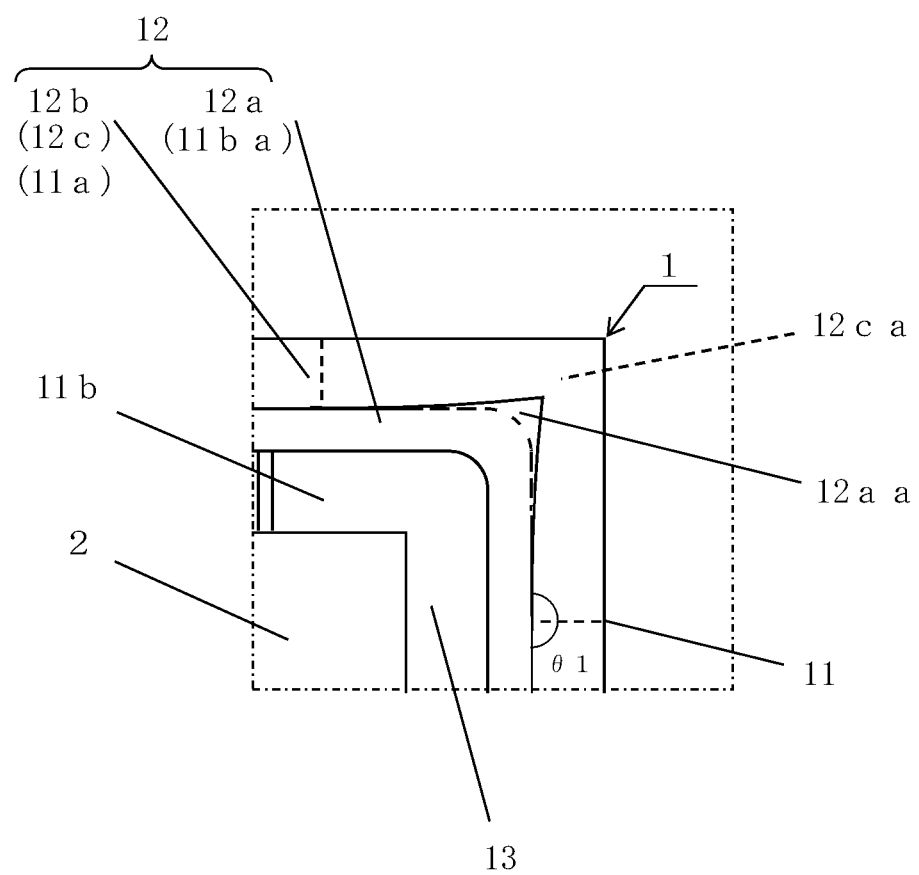
FIG. 11 is an enlarged plan view showing main components of still another example of the electronic device, with the lid body omitted, according to the embodiment.

Moreover, as exemplified in FIG. 11, the protrusion 12aa may be so shaped as to be gradually widened along each of adjacent sides toward a corner in the aluminum layer as seen in a plan view. With the above-described configuration, for example, when joining the lid body 4 to the exposed portion 12c of the electronic component mounting package 1 via a joining material, in the presence of the protrusion 12aa of the aluminum layer, which is less likely to be wet by the joining material, extending toward the exposed portion 12c as seen in a plan view, the joining material is less likely to be located at the protrusion 12aa shaped so as to be gradually widened along each of the adjacent sides toward the corner. This further reduces the interference of the joining material with light reflection, and thus permits reflection of light from the aluminum layer. Consequently, the electronic component mounting package 1 achieves more satisfactory light reflection.

Moreover, as exemplified in FIGS. 6 to 11, an outer shape of the aluminum layer is quadrangular as seen in a plan view, and an angle $\theta 1$ between a side of the outer shape of the aluminum layer and the protrusion 12aa is an obtuse angle. With the above-described configuration, for example, when joining the lid body 4 to the exposed portion 12c of the electronic component mounting package 1 via a joining material, the obtuse-angled region of the exposed portion 12c of the metallic layer 12b, which is readily wet by the joining material, facilitates the retention of the joining material at the exposed portion 12c, and the joining material is restrained from flowing toward the recess 11b by the aluminum layer which constitutes the outermost layer 12a, which is less likely to be wet by the joining material. This reduces the interference of the joining material with light reflection, and thus permits reflection of light from the aluminum layer. Consequently, the electronic component mounting package 1 achieves satisfactory light reflection. Note that an outer shape of the protrusion 12aa of the aluminum layer may include a curved configuration, and hence the angle $\theta 1$ between a side of the outer shape of the aluminum layer and the protrusion 12aa is defined as follows. That is, the angle $\theta 1$ is defined as an angle between a side of the outer shape of the aluminum layer and an approximate straight line of a part of the protrusion 12aa located close to the side. The approximate straight line refers to a straight line obtained by least square approximation.

An electronic device is constructed by mounting an electronic component 2 such as a light-emitting element on a mounting section of the electronic component mounting package 1. In the case where the electronic component 2 mounting in the electronic component mounting package 1 is of a flip chip type, the electronic component 2 is mounted in the electronic component mounting package 1 by electrically and mechanically connecting the electrode of the electronic component 2 and the wiring conductor 13 via a connecting member 3 such as a solder bump or a gold bump. On the other hand, in the case where the electronic component 2 is of a wire bonding type, the electronic component 2 is mounted in the electronic component mounting package 1 by fixing the electronic component 2 on the wiring conductor 13 via a joining material such as solder and then electrically connecting the electrode of the electronic component 2 and the wiring conductor 13 via a connecting member such as a bonding wire.

For example, those that exemplify the electronic component 2 are light-emitting elements including various LEDs (Light Emitting Diodes) for emitting visible light, infrared rays, and ultraviolet rays. The electronic component 2 is sealed by using a joining material such as AuSn and the lid body 4 which is made of glass, resin, ceramics, or the like, and whose sealing portion is provided with a gold layer, a platinum layer, or a chromium layer, for example.

The electronic device is connected via solder 6 to a connection pad 41 of the module substrate 5, thereby constituting an electronic module.

The electronic component mounting package 1 according to the present embodiment includes: the insulating base body 11 including the principal face 11a and the recess 11b which opens in the principal face 11a; and the metallic pattern 12 including a plurality of metallic layers lying across the side face 11ba of the recess 11b and the principal face 11a. The metallic pattern 12 includes at least one metallic layer 12b selected from a tungsten layer, a nickel layer, and a gold layer, as an inner layer, and the aluminum layer as the outermost layer 12a. The metallic pattern 12 also includes the exposed portion 12c corresponding to a part of the inner metallic layer 12b exposed at the principal face 11a of the insulating base body 11. In this construction, for example, when joining the lid body 4 to the exposed portion 12c of the electronic component mounting package 1, a joining material used to join the lid body 4 to the exposed portion 12c of the electronic component mounting package 1 may be readily retained at the exposed portion 12c so as not to flow toward the recess 11b by the aluminum layer which constitutes the outermost layer 12a, which is less likely to be wet by the joining material. This reduces the interference of the joining material with light reflection, and thus permits reflection of light from the aluminum layer. Consequently, the electronic component mounting package 1 achieves satisfactory light reflection.

The electronic device according to the embodiment includes: the electronic component mounting package 1 described above; the electronic component 2 mounted in the electronic component mounting package 1; and the lid body 4 joined to the exposed portion 12c of the electronic component mounting package 1. Thus constructed, the electronic device achieves satisfactory external light radiation.

The electronic module according to the embodiment includes: the module substrate 5; and the electronic device described above, connected to the module substrate 5. Thus constructed, the electronic module achieves satisfactory external light radiation.

The disclosure is not limited to the embodiments described heretofore, and thus various changes and modifications may be made therein. For example, while the insulating base body 11 and the recess 11b are each quadrangular as seen in a plan view, they may be circular as seen in a plan view instead. Moreover, the electronic component mounting package 1 may receive a plurality of electronic components 2 therein, and, on an as needed basis, for example, a small-sized electronic component such as a Zener diode, a resistor element, or a capacitance element may be mounted in the electronic component mounting package 1.

The invention claimed is:

1. An electronic component mounting package, comprising:
    an insulating base body comprising a principal face and a recess which opens in the principal face; and
    a metallic pattern comprising a plurality of metallic layers lying across a side face of the recess and the principal face,
    the metallic pattern comprising, as an inner layer, at least one metallic layer selected from a tungsten layer, a nickel layer, and a gold layer, and an aluminum layer as an outermost layer, the metallic pattern comprising an exposed portion corresponding to a part of the metallic layer exposed at the principal face,
    the aluminum layer comprising a portion lying across the side face of the recess and a part of the principal face located close to the recess,
    an outer shape of the aluminum layer being quadrangular as seen in a plan view of the electronic component mounting package,
    the aluminum layer comprising a protrusion which protrudes toward the exposed portion as seen in a plan view of the electronic component mounting package,
    as seen in a plan view of the electronic component mounting package, the protrusion being located only at a side or corner of the aluminum layer, or being so shaped as to be gradually widened along adjacent sides toward a corner in the aluminum layer.

2. The electronic component mounting package according to claim 1,
    wherein the exposed portion is of a frame shape, and the exposed portion comprises a narrow region which is partly reduced in width.

3. The electronic component mounting package according to claim 2,
    wherein the narrow region is located at a side of the exposed portion.

4. The electronic component mounting package according to claim 2,
    wherein the narrow region is located at a corner of the exposed portion.

5. The electronic component mounting package according to claim 1, wherein an angle between a side of the outer shape of the aluminum layer and the protrusion is an obtuse angle.

6. An electronic device, comprising:
    the electronic component mounting package according to claim 1;
    an electronic component mounted in the electronic component mounting package; and
    a lid body joined to the exposed portion of the electronic component mounting package.

7. An electronic module, comprising:
    a module substrate comprising a connection pad; and
    the electronic device according to claim 6, connected via solder to the connection pad.

* * * * *